(12) United States Patent
Kim

(10) Patent No.: US 7,256,096 B2
(45) Date of Patent: Aug. 14, 2007

(54) SEMICONDUCTOR DEVICE HAVING A DUAL-DAMASCENE GATE AND MANUFACTURING METHOD THEREOF

(75) Inventor: Jung Gyu Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 350 days.

(21) Appl. No.: 11/024,629

(22) Filed: Dec. 30, 2004

(65) Prior Publication Data

US 2005/0142718 A1    Jun. 30, 2005

(30) Foreign Application Priority Data

Dec. 31, 2003   (KR) .................... 10-2003-0101852

(51) Int. Cl.
*H01L 21/336* (2006.01)
(52) U.S. Cl. ................ 438/305; 438/595; 257/E21.438
(58) Field of Classification Search ................ 438/305, 438/529, 595; 257/E21.438
See application file for complete search history.

(56) References Cited

U.S. PATENT DOCUMENTS 6,607,950 B2 *  8/2003  Henson et al. .............. 438/197
6,632,717 B2 * 10/2003  Kim et al. ................... 438/291
2002/0068394 A1 *  6/2002  Tokushige et al. .......... 438/183

FOREIGN PATENT DOCUMENTS

KR    2002-0075575    10/2002

\* cited by examiner

*Primary Examiner*—Chandra Chaudhari
(74) *Attorney, Agent, or Firm*—Lowe Hauptman & Berner LLP

(57) ABSTRACT

A method of manufacturing a semiconductor device having a dual-damascene gate including forming LDD regions by forming a gate oxide film on a semiconductor substrate, and by implanting lowly-concentrated impurities in the semiconductor substrate in accordance with a predetermined LDD pattern, and forming a nitride film on the gate oxide film, and forming a wide nitride film in accordance with the wide nitride pattern. The method also includes forming a narrow nitride film by a narrow etching process on the wide nitride film in accordance with a predetermined narrow nitride film pattern, forming a dual-damascene gate by depositing a polysilicon layer on an exposed entire surface and smoothing the deposited polysilicon layer to a top surface of the nitride film, and forming a gate electrode by removing a predetermined region of the polysilicon layer. The method further includes forming a sidewall nitride film on the gate electrode by etching the exposed nitride film in accordance with a nitride film pattern, and forming source/drain regions by performing an ion implantation process on the source/drain regions.

10 Claims, 7 Drawing Sheets

SEMICONDUCTOR DEVICE HAVING A DUAL-DAMASCENE GATE AND MANUFACTURING METHOD THEREOF

BACKGROUND OF THE INVENTION

1. Field of the Invention

The present invention relates to a semiconductor device with a dual-damascene gate and a method of manufacturing the semiconductor device, and more particularly, to a semiconductor device having a dual-damascene gate capable of miniaturizing a gate pattern.

2. Description of the Related Art

Hereinafter, a related art method of manufacturing a semiconductor device having a gate will be schematically described with reference to FIGS. 1A to 1G.

FIGS. 1A to 1G are flowcharts showing the related art method of manufacturing a semiconductor device having a gate.

In general, in the related art method of manufacturing the semiconductor device having a gate, a pad oxide film or a gate oxide film 12 is formed on a semiconductor substrate or a silicon wafer 11, as shown in FIG. 1A. As shown in FIG. 1B, an N+ polysilicon layer 13 is deposited. As shown in FIG. 1C, a polysilicon layer gate 13' is formed by a photolithography process. Lightly doped drain (LDD) regions 14a and 14b are formed by implanting impurities on an active region where source/drain regions are formed.

As shown in FIG. 1D, the gate oxide film 12 on the LDD regions 14a and 14b is removed. An insulating film, for example a nitride film, is deposited. A sidewall nitride film 15 is formed on a sidewall of the polysilicon gate 13' by etching the nitride film.

As shown in FIG. 1E, highly-concentrated impurities are implanted in the source/drain active regions to form source/drain regions 16a and 16b.

As shown FIG. 1F, titanium (Ti) is deposited by a sputtering method to form a Ti film 17.

As shown in FIG. 1G, a Ti silicide 17' is formed by reacting Ti ions of the Ti film with Si ions. The Ti silicide film 17' is selectively removed using a wet etchant from a portion of the Ti film 17 where the Ti ions do not react with the Si ions.

However, there is problem in that, in a related art gate profile forming method using patterning and dry etching processes, it is difficult to control a critical dimension (CD) of a gate and effectively implement the gate profile as the design size is reduced with improvement in a semiconductor technology.

SUMMARY OF THE INVENTION

In order to solve the above-mentioned problems, the present invention advantageously provides a semiconductor device having a dual-damascene gate capable of miniaturizing a gate pattern by forming a narrow gate using a dual-damascene method, and a method of manufacturing the semiconductor device.

In addition, the present invention provides a semiconductor device having a dual-damascene gate capable of increasing reproducibility of the etching process by stably controlling a critical dimension (CD). The gate is also capable of stably maintaining a direct current (DC). A method of manufacturing the semiconductor device is also provided.

In addition, the present invention further provides a semiconductor device having a dual-damascene gate capable of increasing yields of the semiconductor device by forming a silicide film so that a height of a gate electrode is lower than that of a side insulating film. This prevents the occurrence of bridges between the source and drain regions.

In order to achieve the above-mentioned objects, according to an aspect of the present invention, a method of manufacturing a semiconductor device having a dual-damascene gate includes forming lightly doped drain (LDD) regions by forming a gate oxide film on a semiconductor substrate and implanting lowly-concentrated impurities in the semiconductor substrate in accordance with a predetermined LDD pattern, forming a nitride film on the gate oxide film and forming a wide nitride film in accordance with the wide nitride pattern, forming a narrow nitride film by a narrow etching process on the wide nitride film in accordance with a predetermined narrow nitride film pattern, forming a dual-damascene gate by depositing a polysilicon layer on an exposed entire surface and smoothing the deposited polysilicon layer until a top surface of the nitride film is exposed, forming a gate electrode by removing a predetermined portion of the polysilicon layer, forming a sidewall nitride film on the gate electrode by etching the exposed nitride film in accordance with a nitride film pattern, and forming source/drain regions by performing an ion implantation process on the source/drain active regions.

In addition, in the step of forming the wide nitride film, the nitride film of about 2,500 Å to about 3,000 Å may be deposited. The nitride film may be etched in accordance with the etching pattern of the wide nitride film until a nitride film with a thickness of about 500 Å to about 1,000 Å remains.

In addition, the polysilicon layer may be deposited by using a chemical vapor deposition (CVD) method.

In addition, a critical dimension (CD) of the gate may be controlled by the narrow nitride film formed by the narrow etching process.

In addition, the dual-damascene gate may be formed by depositing the polysilicon layer with a CVD method and removing the polysilicon layer of about 500 Å to about 1,000 Å with a chemical mechanical polishing (CMP) method.

In addition, the gate electrode may be formed by performing a blanket etching process using an etching selectivity between the gate electrode and the sidewall nitride film to remove an upper portion of the polysilicon layer to a depth of about 300 Å to about 500 Å.

In addition, the method may further comprise a step of forming a silicide on the gate electrode and source/drain regions.

In addition, the step of forming the silicide include forming a metallic film by depositing metal ions on the entire surface of the semiconductor substrate including the gate electrode, forming a metallic silicide film on the gate electrode and the source/drain regions by reacting silicon ions of the semiconductor substrate with the metal ions of metallic film, and selectively removing a portion of the metallic film where the metal ions do not react with the silicon ions.

In addition, the metallic film may be formed to have a thickness of about 200 Å to about 400 Å by a sputtering method. The metallic film may be a titanium (Ti) film or a cobalt (Co) film.

In addition, the polysilicon ions are reacted with the metal ions by using a rapid thermal annealing (RTA) process.

In addition, the step of selectively removing the metallic film is performed using a wet etchant including a mixed solution of a hydrogen peroxide ($H_2O_2$) solution and a sulfuric acid ($H_2SO_4$) solution.

According to another aspect of the present invention, a semiconductor having a dual-damascene gate includes lightly doped drain (LDD) regions formed by implanting low-concentrated impurities in the semiconductor substrate where a gate oxide film is formed, a sidewall nitride film formed by performing a narrow etching process on a wide nitride film which is formed at the side of a wide gate region on the gate oxide film, a gate electrode formed in the sidewall nitride film by depositing a polysilicon layer with a dual-damascene process, source/drain regions formed by implanting highly-concentrated impurities in an active region of the semiconductor, and a silicide film formed on the gate electrode and the source/drain regions.

According to the present invention, it is possible to miniaturize a gate pattern corresponding to the reduction of a design size by forming a gate electrode using a dual-damascene method. It is further possible to control a critical dimension (CD) of a gate in a narrow nitride etching in advance, contrary to the conventional technology, and to prevent the generation of a notch and a foot caused by a doping effect when the etching is performed after implanting N+ polysilicon ions. Further, since the ion implantation is performed after making a vertical profile, it is possible to make a stable gate profile. By such a stable profile, it is possible to prevent the failure of a direct current, which can occur post process.

It is to be understood that both the foregoing general description and the following detailed description of the present invention are exemplary, but are not restrictive of the invention.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Now, exemplary embodiments of the present invention will be described with reference to the attached drawings. However, the present invention can be embodied in various modifications and thus is not limited to the embodiments described below.

FIGS. 2A to 2M illustrate a method of manufacturing a semiconductor device having a dual-damascene gate according to the present invention.

Figure 1A:
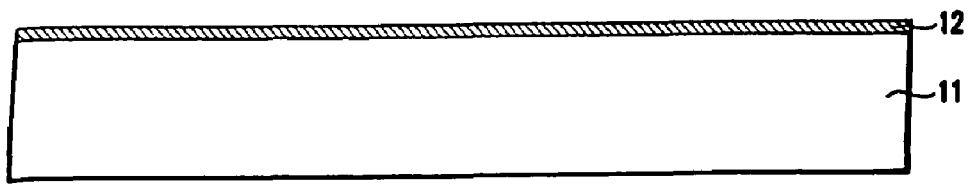
FIGS. 1A to 1G illustrate a related art method of manufacturing a semiconductor device having a gate.
Figure 1B:
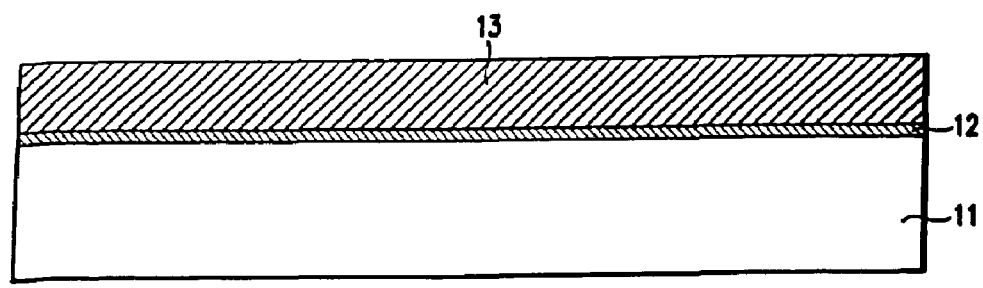
Figure 1C:
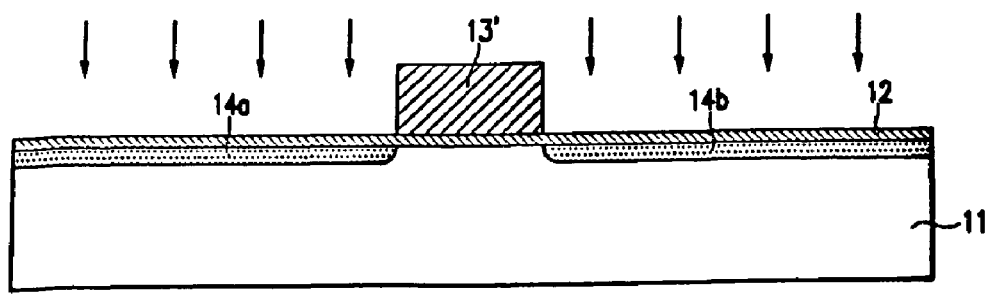
Figure 1D:
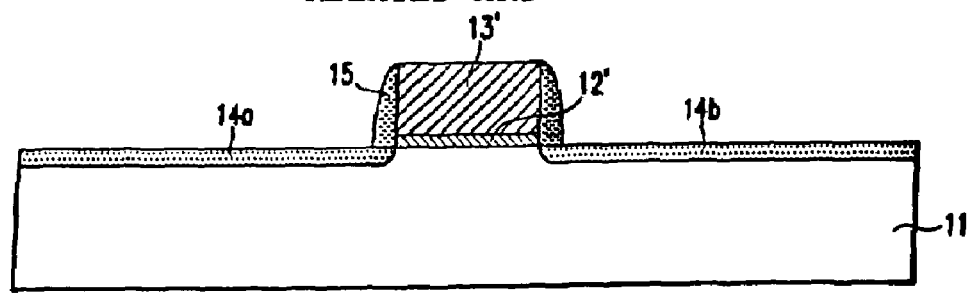
Figure 1E:
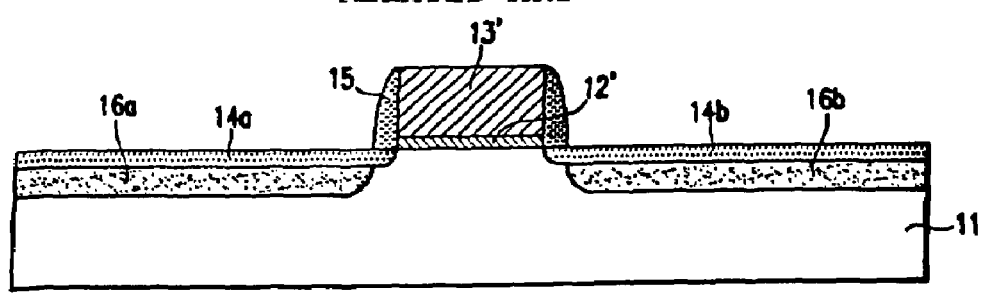
Figure 1F:
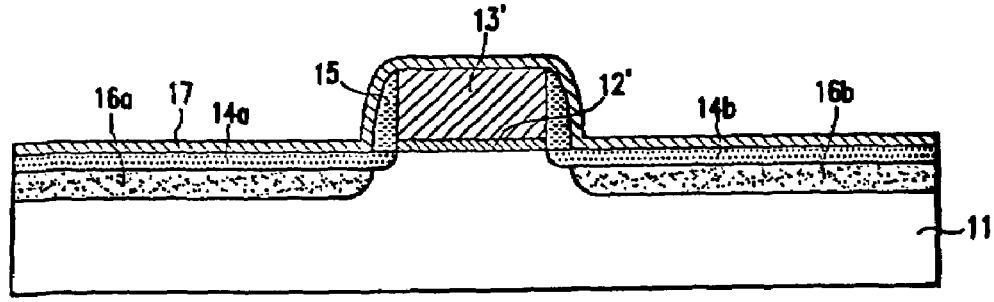
Figure 1G:
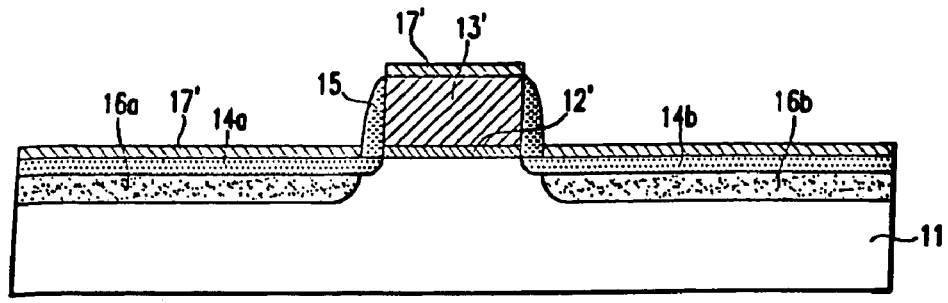
Figure 2A:
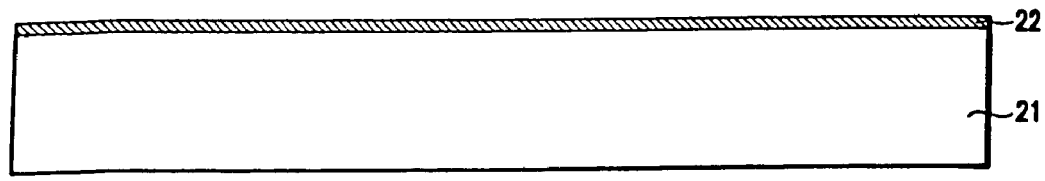
FIGS. 2A to 2M illustrate a method of manufacturing a semiconductor device having a dual-damascene gate according to the present invention.
Figure 2B:
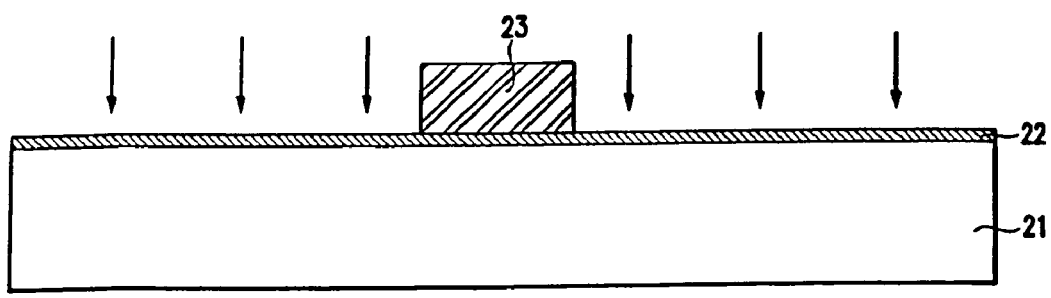
Figure 2C:
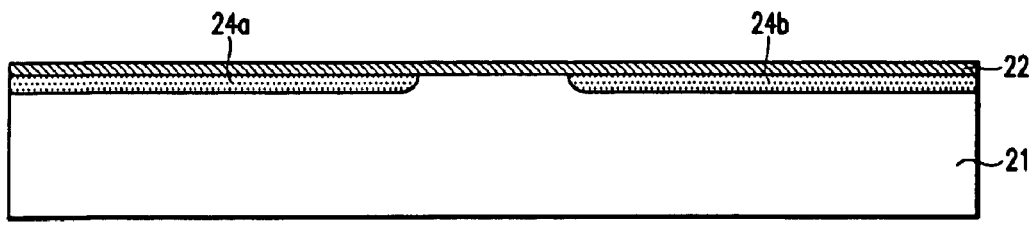

In a semiconductor device having a dual-damascene gate according to the present invention and a method of manufacturing the semiconductor device, as shown in FIG. 2A, a gate oxide film 22 is formed on a semiconductor substrate or silicon wafer 21. As shown in FIG. 2B, a first photosensitive film pattern 23 is formed on the gate oxide film 22. As shown in FIG. 2C, lightly doped drain (LDD) regions 24a and 24b are formed by performing an ion implantation process (see also FIG. 2B).

Figure 2D:
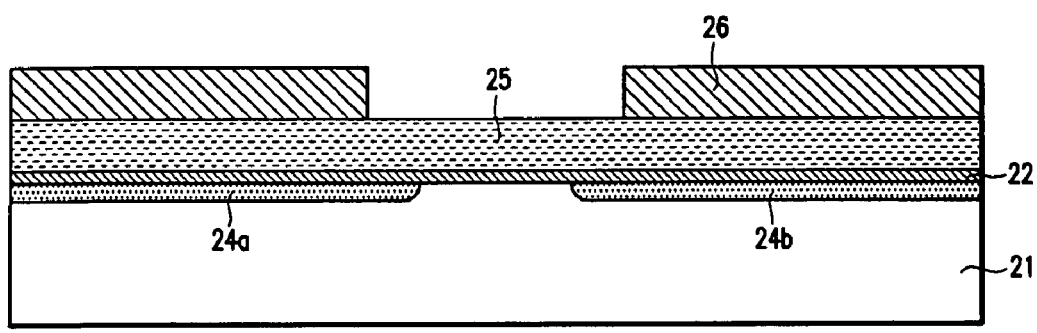
Figure 2E:
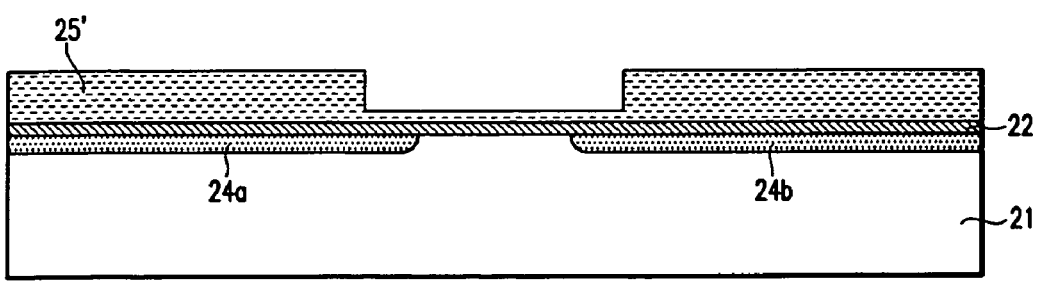

As shown in FIG. 2D, a nitride film 25 is formed on the gate oxide film 22 by depositing a nitride thereon. A second photosensitive film pattern 26 is formed on the nitride film 25. As shown in FIG. 2E, a first wide nitride film 25' is formed by etching the nitride film 25 from the areas exposed by the second photosensitive film pattern 26.

More specifically, after the process of forming the gate oxide film 22 and the process of forming the LDD regions 24a and 24b, the nitride film 25 having a depth of about 2,500 Å to about 3,000 Å is deposited. An etching pattern for the first wide nitride film 25' is formed. The nitride film 25 is etched until the thickness thereof becomes about 500 Å to about 1,000 Å.

Figure 2F:
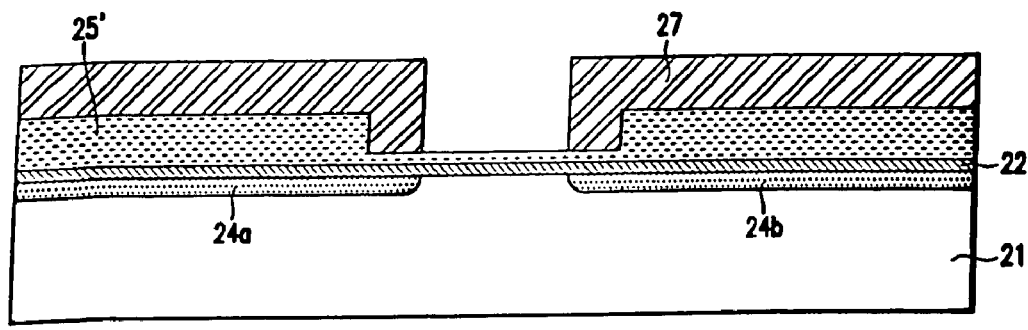
Figure 2G:
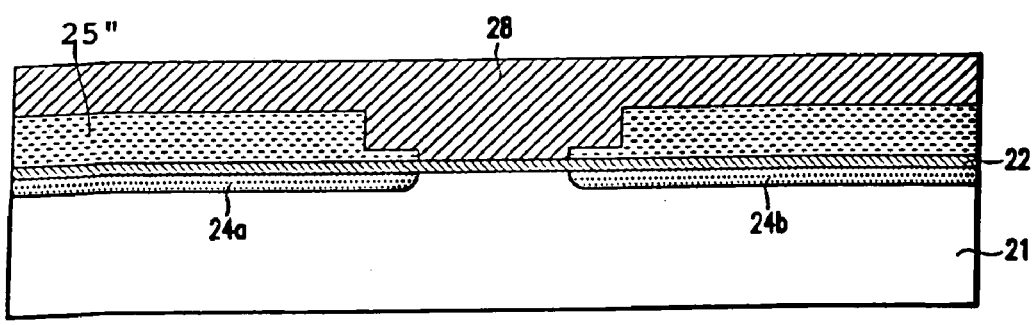

As shown in FIG. 2F, a narrow nitride film pattern 27 for a narrow gate is formed. As shown in FIG. 2G, a narrow nitride film 25" is formed by a first narrow etching process on the wide nitride film 25', in accordance with the narrow nitride film pattern 27. A polysilicon layer 28 is deposited on the exposed entire surface by using a CVD method. Here, a critical dimension (CD) of a gate can be easily controlled by using the first narrow etching process.

Figure 2H:
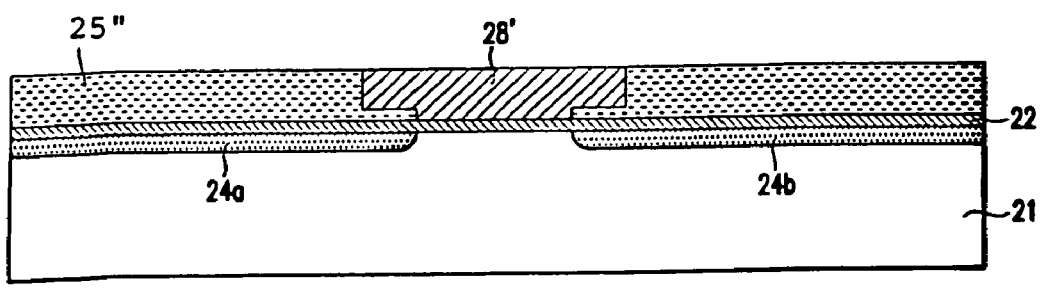

As shown in FIG. 2H, the portion where the polysilicon layer 28 is deposited is smoothed by using a chemical mechanical polishing (CMP) method until the top surface of the polysilicon layer 28 is in the same plane as the top surface of the nitride film. Thus, a dual damascene gate 28' including an N+ polysilicon layer is obtained. More specifically, after the polysilicon layer is deposited by using the CVD method, the smoothing process is performed to remove a depth of the polysilicon layer of about 500 Å to about 1000 Å.

Figure 2I:
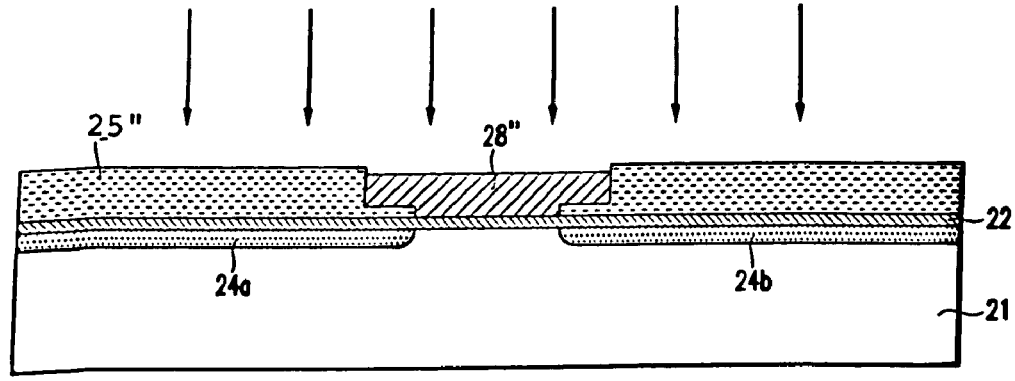

As shown in FIG. 2I, to prevent the generation of a bridge between the gate electrode 28' and the source/drain regions when forming a metallic silicide during subsequent processes, a blanket etching process is performed. The blanket etching uses an etching selectivity between the N+ polysilicon layer, which is the gate electrode 28', and the nitride, which is the insulating film sidewall material, to remove a predetermined portion of the polysilicon layer 28'. A depth of the polysilicon layer 28' of about 300 Å to about 500 Å is removed to form a gate electrode 28".

Figure 2J:
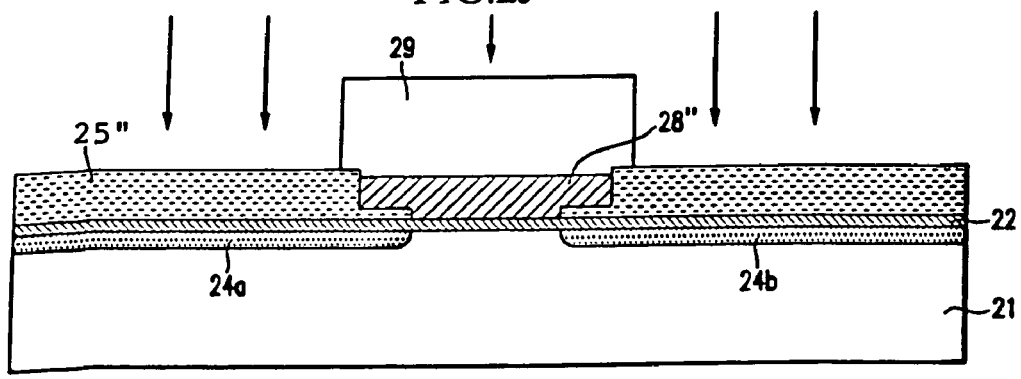

As shown in FIG. 2J, a sidewall nitride film pattern 29 is formed on the gate electrode 28". The entire surface of the nitride film 25" exposed by the sidewall nitride film pattern is etched.

Figure 2K:
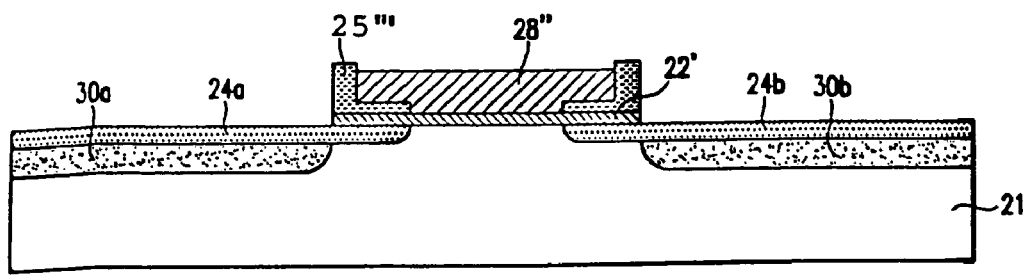

The entire exposed nitride film 25" is etched to form a sidewall nitride film 25''', as shown in FIG. 2K. An ion implantation process is performed on the source/drain active regions to form source/drain regions 30a and 30b.

Figure 2L:
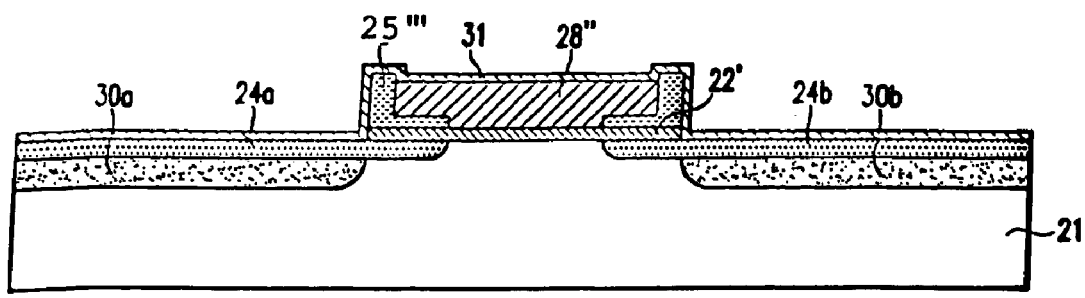

As shown in FIG. 2L, a Ti film 31 having a thickness of about 200 Å to about 400 Å is formed above the entire surface of the semiconductor substrate including the gate electrode 28" using a sputtering method. Here, a cobalt (Co) film may be formed instead of the Ti.

Figure 2M:
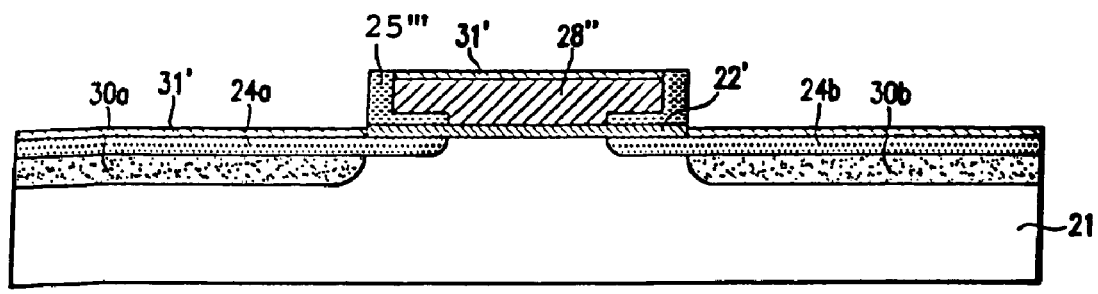

As shown in FIG. 2M, by performing by a rapid thermal annealing (RTA) process, a Ti silicide film 31' ($TiSi_2$) is formed on the gate electrode 28" and the source/drain regions 30a and 30b by reacting Si ions of the semiconductor substrate with Ti ions of the Ti film. A portion of the Ti film 31 where the Ti ions do not react with the Si ions is selectively removed using a wet etchant including a mixed solution of a hydrogen peroxide ($H_2O_2$) solution and a sulfuric acid ($H_2SO_4$) solution to finally form a Ti silicide film 31'.

A semiconductor device having a dual-damascene gate according to present invention includes lightly doped drain (LDD) regions 24a and 24b formed by implanting low-concentrated impurities in the semiconductor substrate where a gate oxide film 22' is formed, a sidewall nitride film 25''' formed by performing a narrow etching process on a wide nitride film which is formed at the side of a wide gate region on the gate oxide film 22', a gate electrode 28" formed in the sidewall nitride film 25''' by depositing a polysilicon layer using a dual-damascene process, source/drain regions 30a and 30b formed by implanting highly-concentrated impurities in an active region of the semiconductor substrate 21, and a silicide film 31' formed on the gate electrode 28" and the source/drain regions 30a and 30b.

According to the present invention, to overcome above-mentioned problems in conventional technology, a narrow nitride film is etched in advance, contrary to the conventional technology, so that it is possible to control a critical dimension (CD) of a gate.

Further, it is possible to prevent the generation of a notch and a foot caused by a doping effect when the etching is performed after implanting N+ ploysilicon ions. Further, since the ion implantation process is performed after making a vertical profile. Accordingly, it is possible to make a stable profile. By such a stable profile, it is possible to previously prevent the failure of a direct current during subsequent processes.

According to the present invention, in the gate forming method, the nitride film is previously etched. A gate electrode is formed with a dual-damascene process, not polysilicon etching process, so that the reduction of gate size cannot largely affect the gate profile. Therefore, it is possible to stably control the device.

Further, according to the present invention, it is possible to prevent contact misalignment when forming the gate with a wide polysilicon layer.

Further, according to the present invention, it is possible to increase yields of the semiconductor device and to prevent occurrence of bridges between the source and drain regions by forming a Ti silicide so that a height of a gate electrode is lower than that of a side insulating film.

Korean Patent Application No. 10-2003-0101852, filed on Dec. 31, 2003, is hereby incorporated by reference in its entirety.

While the present invention has been particularly shown and described with reference to exemplary embodiments thereof, it will be understood by those skilled in the art that various changes in form and details may be made therein without departing from the sprit and scope of the invention as defined by the appended claims.

What is claimed is:

1. A method of manufacturing a semiconductor device having a dual-damascene gate, comprising steps of:

forming lightly doped drain (LDD) regions by forming a gate oxide film on a semiconductor substrate and implanting low-concentration impurities in the semiconductor substrate in accordance with a predetermined LDD pattern;

forming a nitride film on the gate oxide film and forming a wide nitride film in accordance with a wide nitride pattern;

forming a narrow nitride film by a narrow etching process on the wide nitride film in accordance with a predetermined narrow nitride film pattern;

forming a dual-damascene gate by depositing a polysilicon layer on an exposed entire surface and smoothing the deposited polysilicon layer until a top surface of the nitride film is exposed;

forming a gate electrode by removing a predetermined portion of the polysilicon layer;

forming a sidewall nitride film on the gate electrode by etching the exposed nitride film in accordance with a nitride film pattern; and forming source/drain regions by performing an ion implantation process on source/drain active regions.

2. The method of claim 1, wherein the step of forming a wide nitride film includes forming the wide nitride film with a thickness of about 2,500 Å to about 3,000 Å and etching the nitride film exposed by the etching pattern until a thickness of the nitride film of about 500 Å to about 1,000 Å remains.

3. The method of claim 1, wherein the step of forming a dual-damascene gate includes depositing the polysilicon layer using a chemical vapor deposition (CVD) method.

4. The method of claim 1, further comprising a step of controlling a critical dimension (CD) of the gate by the narrow nitride film formed by the narrow etching process.

5. The method of claim 1, wherein the step of forming a dual-damascene gate includes forming the dual-damascene gate by depositing the polysilicon layer with a CVD method and removing a depth of the polysilicon layer of about 500 Å to about 1,000 Å with a chemical mechanical polishing (CMP) method.

6. The method of claim 1, wherein the step of forming a gate electrode includes forming the gate electrode by performing a blanket etching process using an etching selectivity between the gate electrode and the sidewall nitride film to remove a depth of an upper portion of the polysilicon layer of about 300 Å to about 500 Å.

7. The method of claim 1, further comprising a step of forming a silicide on the gate electrode and source/drain regions.

8. The method of claim 7, wherein the step of forming a silicide comprises steps of:

forming a metallic film by depositing metal ions on an entire surface of the semiconductor substrate including the gate electrode;

forming a metallic silicide film on the gate electrode and the source/drain regions by reacting silicon ions of the semiconductor substrate with the metal ions of metallic film; and selectively removing a portion of the metallic film where the metal ions do not react with the silicon ions.

9. The method of claim 8, wherein the step of forming a metallic film includes forming a metallic film with a thickness of about 200 Å to about 400 Å by a sputtering method.

10. The method of claim 8, wherein the step of selectively removing a portion of the metallic film includes using a wet etchant including a mixed solution of a hydrogen peroxide ($H_2O_2$) solution and a sulfuric acid ($H_2SO_4$) solution.

* * * * *